(12) United States Patent
Hales (10) Patent No.: US 6,891,490 B2
(45) Date of Patent: May 10, 2005

(54) ANALOG-TO-DIGITAL CONVERTER WITH DIGITAL SIGNAL PROCESSING FUNCTIONALITY TO EMULATE MANY DIFFERENT SAMPLE FREQUENCIES, RESOLUTIONS, AND ARCHITECTURES

(75) Inventor: Rex K. Hales, Salt Lake City, UT (US)

(73) Assignee: Slicex, Inc., Draper, UT (US)

( * ) Notice: Subject to any disclaimer, the term of this patent is extended or adjusted under 35 U.S.C. 154(b) by 0 days.

(21) Appl. No.: 10/454,711

(22) Filed: Jun. 4, 2003

(65) Prior Publication Data

US 2004/0001018 A1 Jan. 1, 2004

Related U.S. Application Data (60) Provisional application No. 60/386,698, filed on Jun. 5, 2002.

(51) Int. Cl.[7] ............................................... H03M 1/12
(52) U.S. Cl. ..................................................... 341/155
(58) Field of Search ................................ 341/120, 155, 341/143, 144, 161, 163, 165

(56) References Cited

U.S. PATENT DOCUMENTS

| | | | | |
|---|---|---|---|---|
| 4,246,571 A | * | 1/1981 | Gariazzo | 341/143 |
| 6,081,215 A | * | 6/2000 | Kost et al. | 341/120 |
| 6,181,099 B1 | * | 1/2001 | Bixel et al. | 318/610 |
| 6,259,804 B1 | * | 7/2001 | Setlak et al. | 382/124 |
| 6,359,575 B1 | * | 3/2002 | Knudsen | 341/118 |
| 6,492,922 B1 | * | 12/2002 | New | 341/120 |
| 6,603,416 B2 | * | 8/2003 | Masenas et al. | 341/120 |
| 6,680,984 B1 | * | 1/2004 | Teghararian et al. | 375/317 |
| 6,686,860 B2 | * | 2/2004 | Gulati et al. | 341/155 |
| 6,734,817 B2 | * | 5/2004 | Naka et al. | 341/155 |
| 6,762,707 B2 | * | 7/2004 | Wolf et al. | 341/155 |
| 2002/0093439 A1 | * | 7/2002 | Lundin et al. | 341/120 |

* cited by examiner

*Primary Examiner*—Peguy JeanPierre
(74) *Attorney, Agent, or Firm*—Steven L. Nichols; Rader, Fishman & Grauer PLLC (57) ABSTRACT

A system for emulating characteristics of a plurality of analog-to-digital converter (ADC) architectures in the conversion of an analog signal to a digital signal. The system comprises a flash ADC for sampling the analog signal and outputting a digital representation of a sample of the analog signal, a digital-to-analog converter (DAC) for supplying the reference values to the flash ADC, and a digital signal processor (DSP) for processing the digital representation of the sample and outputting the digital signal. The digital representation is based on a comparison of the sample to reference values and comprising a number of bits of resolution. The DSP is configured to send a modifiable control signal defining the reference values to the DAC.

28 Claims, 9 Drawing Sheets

ANALOG-TO-DIGITAL CONVERTER WITH DIGITAL SIGNAL PROCESSING FUNCTIONALITY TO EMULATE MANY DIFFERENT SAMPLE FREQUENCIES, RESOLUTIONS, AND ARCHITECTURES

RELATED APPLICATIONS

The present application claims priority under 35 U.S.C. §119(e) from the following previously-filed Provisional Patent Application, U.S. Application No. 60/386,698, filed Jun. 5, 2002 by Rex K. Hales, entitled "Analog to Digital Converter with Digital Signal Processing Functionality to Emulate Many Different Sample Rates, Resolutions, and Architectures," and which is incorporated herein by reference in its entirety.

TECHNICAL FIELD

The present invention relates to the field of converting analog signals to digital signals. More specifically, the present invention relates to highly flexible devices used to convert an analog signal into a digital representation.

BACKGROUND

Analog-to-digital conversion is an electronic process in which an analog signal is changed, without altering its essential content, into a digital signal. Analog-to-digital conversion is performed using an analog-to-digital converter (ADC).

ADCs are used in a wide variety of electronic applications including, but not limited to, communications, imaging, measurement, control systems, sensors, etc. In general, ADCs may be used in any application in which it is desirable for an analog signal, i.e., a continuous electrical signal, to be digitally processed.

The converting of an analog signal to its digital counterpart is accomplished by repeatedly sampling a continuous analog signal, i.e., checking the voltage or current level at a fixed time, and outputting a digital approximation of each sample. The benefits of converting an analog signal to its digital representation include, but are not limited to, noise reduction and the ability to use computers and computing software to analyze and manipulate the signal, etc.

ADCs have numerous characteristics that may be altered depending on the particular purpose for which they are designed. These characteristics include sample rate, resolution, latency, power consumption, physical size, and cost. Sample rate refers to how often samples of the analog signal are made. Resolution refers to how many bits are used to represent the digital approximation of the analog signal for each sample. Higher resolution ADCs are capable of better digital approximation of the analog signal. Latency is the difference between the time an analog sample is acquired by the ADC and the time when the digital data is available at the output of the ADC.

As already stated, when implementing an ADC, the application normally determines which ADC architecture will be used. For example, while some applications may need high resolution, other architectures do not, but instead require a high sample rate. As presently understood in the art, a tradeoff exists between sample rate and resolution, i.e., the sample rate inversely affects the resolution and visa versa.

An exemplary application that requires ADCs with high sample rates is a wireless network. Wireless networks usually require ADCs that have high sample rates of at least 20 megasamples per second (MSPS). ADCs designed to work in wireless networks preferably consume little power and have low latency. They typically only need to be capable of moderate resolution.

Audio systems, on the other hand, typically only require ADCs with sample rates of 20–50 kHz. These ADCs may have moderate to high latency, but they usually have to be capable of high resolutions. Power consumption is not a stringent requirement in many audio systems.

Voice systems for use in cellular phone applications require ADCs that have even lower sample rates and resolution than do ADCs designed for use in audio systems. However, they preferably do not consume as much power as do ADCs in audio systems.

Wireless networks, audio systems, and voice systems are examples of the many applications that require ADCs with different characteristics. There are a variety of ADC architectures, each with different characteristics, that may be used for analog to digital conversion in these applications. These ADC architectures include, but are not limited to, pipelined ADCs, Sigma Delta (or Delta Sigma) ADCs, Successive Approximation Register (SAR) ADCs, Dual-slope ADOs, and Flash ADCs. Each of these ADC architectures is capable of different sample rates, resolutions, latencies, and power consumption. They vary in size and cost as well.

In developing a new electronic product or application that use ADCs, there are often several stages of testing, production, troubleshooting, etc., during which changes are made to the product that may affect the required characteristics of an ADC that is being used in the product. Changes in ADC characteristic requirements could result in the need to use a different ADC architecture than the one being currently used. It is often difficult, time consuming, and costly to change from one ADC architecture to another that has the desired characteristics. Thus, it is desirable to have a single ADC with characteristics that may be easily configured so as to emulate different ADC architectures.

SUMMARY

A system for emulating characteristics of a plurality of analog-to-digital converter (ADC) architectures in the conversion of an analog signal to a digital signal. The system comprises a flash ADC for sampling the analog signal and outputting a digital representation of a sample of the analog signal, a digital-to-analog converter (DAC) for supplying the reference values to the flash ADC, and a digital signal processor (DSP) for processing the digital representation of the sample and outputting the digital signal. The digital representation is based on a comparison of the sample to reference values and comprising a number of bits of resolution. The DSP is configured to send a modifiable control signal defining the reference values to the DAC.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

An analog-to-digital converter (ADC) with digital signal processor (DSP) functionality is described herein. According to an exemplary embodiment of the present invention, the DSP functionality allows the ADC to operate using different sample rates, resolutions, and latencies. In this way, the ADC may emulate many different ADC architectures.

Figure 1:
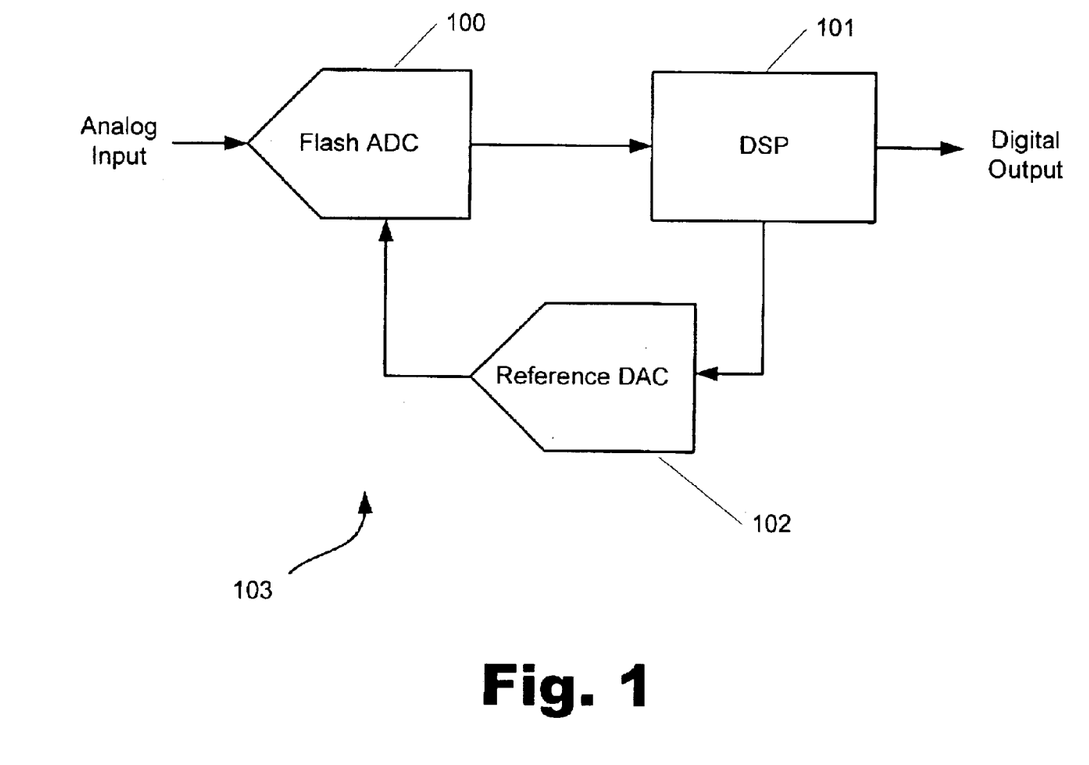
FIG. 1 is a simplified block diagram illustrating an exemplary ADC system with DSP functionality that is configured to emulate characteristics of many ADC architectures, according to an embodiment of the present invention.

FIG. 1 is a simplified block diagram illustrating an exemplary ADC system with DSP functionality (103) that is configured to emulate characteristics of many ADC architectures, according to an embodiment of the present invention. As shown in FIG. 1, the system (103) consists of a flash ADC (100), a digital signal processor (DSP) (101), and reference digital-to-analog converter (DAC) (102). The preferred embodiments of the ADC system with DSP functionality (103) will be explained in more detail further below.

Before the preferred embodiments of the ADC system with DSP functionality (103) are explained, various ADC architectures that the ADC system with DSP functionality (103) may emulate will be explained using the exemplary diagrams of FIGS. 1–5 to understand the present invention.

Most conventional ADCs have three common functions. These are reference, control and comparison functions. The difference between ADC architectures is primarily the quantity, type, and interconnection of these functions. The reference function provides a voltage reference that is compared with an analog input by the comparison function. The control function takes the output of the comparison function and uses it to determine a digital representation for the analog input.

The building blocks used to create the reference, control and comparison functions vary in specification and implementation, but can generally be broken down into summation, gain (which can be either greater or less than 1), scaling, comparator, and digital logic. Some type of digital to analog converter (DAC) is often used to provide the reference function.

The comparison function can be performed by a single comparator, which compares an input voltage to a reference voltage. If the input voltage is higher than the reference voltage the comparator outputs a high logic value, otherwise the comparator outputs a low logic value. Alternatively, multiple comparators may be used together to provide multiple logic outputs. Usually, multiple comparators are used to provide higher accuracy in estimating the analog input voltage level.

Figure 2:
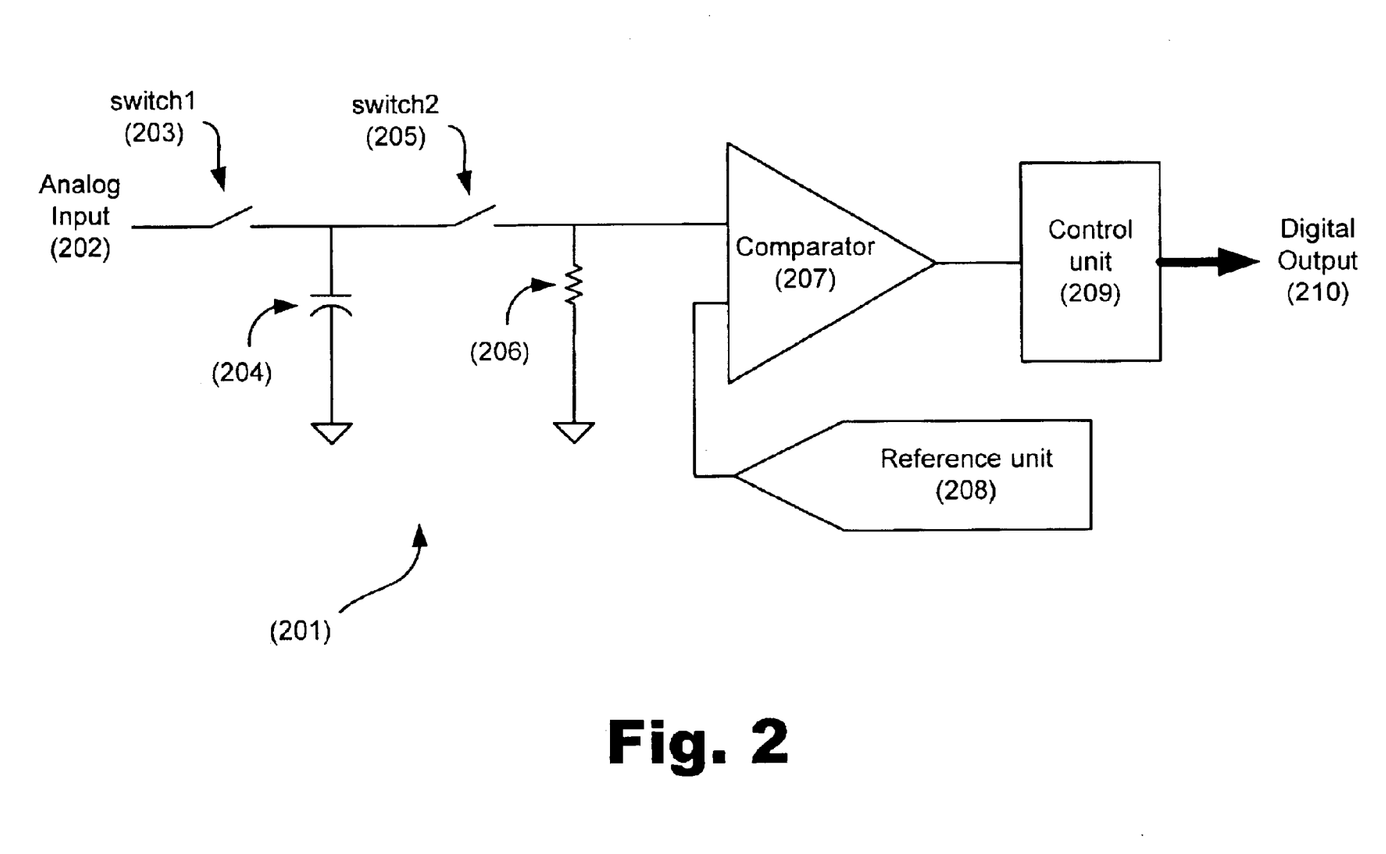
FIG. 2 is a simplified block diagram illustrating an embodiment of a dual slope ADC architecture.

FIG. 2 is a simplified block diagram illustrating an embodiment of a dual slope ADC architecture (201). Dual slope ADCs are sometimes referred to as integrating ADCs. As shown in FIG. 2, the dual slope ADC (201) comprises an analog input (202), a first switch (203), a capacitor (204), a second switch (205), a resistor (206), a comparator (207), a reference unit (208), a control unit (209), and a digital output (210).

The capacitor (204) stores the value of the analog input (202) when first switch (203) is closed and second switch (205) is open. Alternatively, other analog storage elements may be used in place of the capacitor (204). After the capacitor (204) is charged to the value of the analog input (202), first switch (203) is opened and second switch (205) is closed. The stored voltage value on the capacitor (204) is then removed by a discharge element, such as a resistor (206).

The control unit (209) is a counter that counts time for as long it takes to remove the voltage value from the capacitor (204) until its value is the same or less than the reference value provided by the reference unit (208). The accuracy of the digital output (210) depends on the frequency of the counter in the control unit (209) and the ability to measure the discharge of the capacitor (204).

For example, suppose the analog input (202) stored by the capacitor (204) is 2.625 volts, and it takes 200 microseconds for the capacitor (204) to discharge causing the comparator (207) to change value. If each count by the control unit (209) takes 20 microseconds and is approximated to equal 0.5 volts, 5 counts would occur before the voltage on the capacitor (204) is discharged, and the control unit (209) would produce a 2.5 volt digital output (210). The switches (203, 205) are then reversed, charging the capacitor (204) to the voltage level of the analog input (202), and the process is repeated.

Dual slope ADCs are typically configured to operate at a low to medium sample rate. They also typically provide high resolution.

Figure 3:
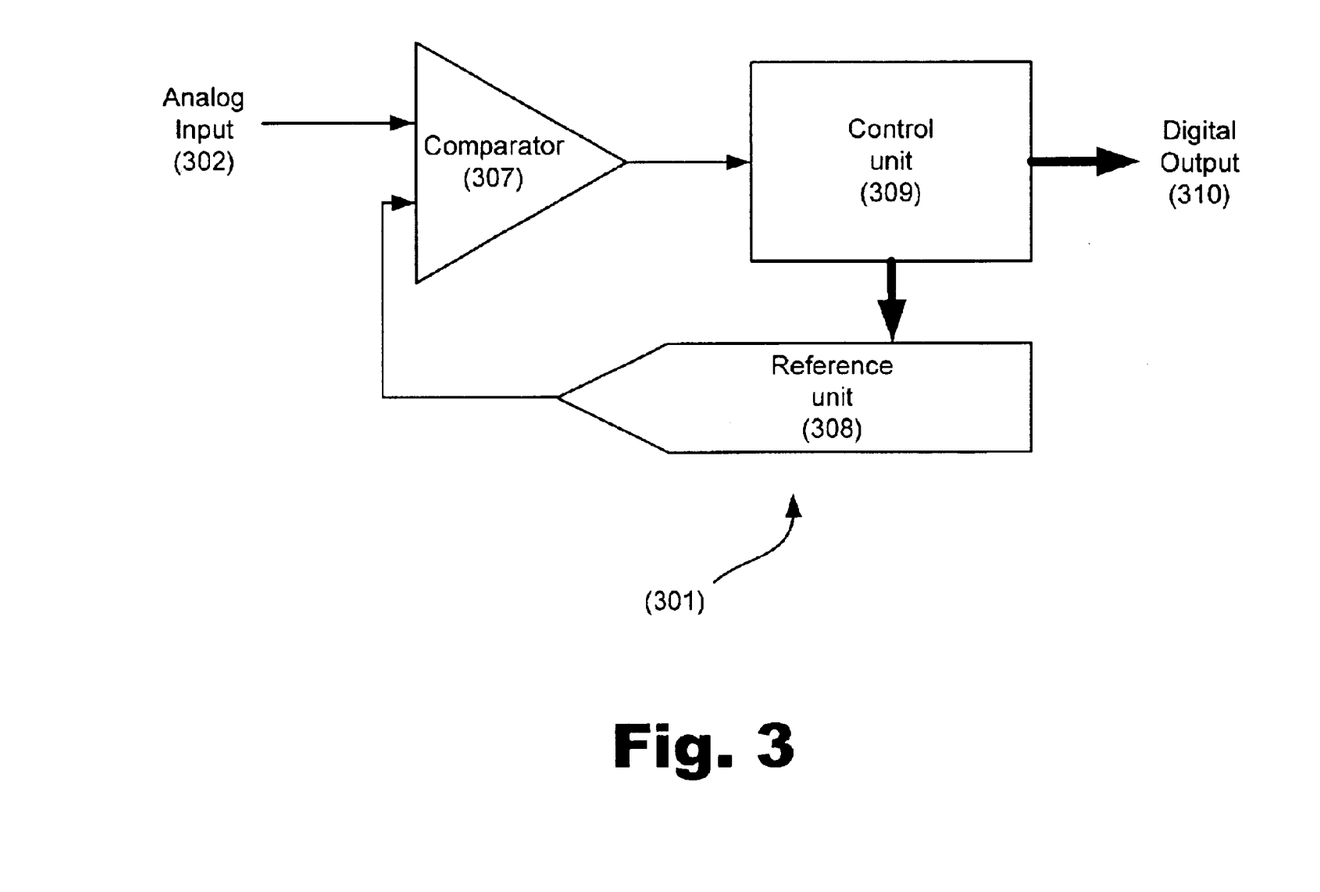
FIG. 3 is a simplified block diagram illustrating an embodiment of a Successive Approximation Register (SAR) ADC architecture.

FIG. 3 is a simplified block diagram illustrating an embodiment of a Successive Approximation Register (SAR) ADO architecture (301). As shown in FIG. 3, a SAR ADC (301) generally uses a single comparator (307) to determine if the analog input voltage (302) is higher or lower than the reference value provided by the reference unit (308). The output of the comparator (307) goes to the control unit (309) which changes the voltage value provided by the reference unit (308). In a common embodiment, the reference unit (308) is a DAC. The reference unit (308) provides a digital to analog conversion that is changed by the control unit (309) to a value that is either smaller or larger than the current value depending on the output of the comparator (307). This is typically done in a binary search pattern, i.e., an approximation process intended to minimize the number of cycles required.

As an example of the operation of the SAR architecture and binary search pattern, suppose the analog input (302) is 2.625 volts and the reference voltage provided by the reference unit (308) is 1.0 volt. The comparator (307) would output a high logic value to the control unit (309), which then increases the reference value of the reference unit (308) by, for example, 2.0 volts, resulting in a new reference value of 3.0 volts. Since 2.625 volts is less than the 3.0 volt reference, the comparator (307) would output a logic low, causing the control unit (309) to lower the reference voltage of the reference unit (308).

Using this binary search pattern, the change in voltage level is divided in half once the range of the analog input (302) has been determined. In the example above, the SAR ADC (301) now knows that the voltage level is between 1.0 volt (the original reference voltage) and 3.0 volts (the most recent reference voltage). Therefore, if the control unit (309) uses a binary search pattern, the voltage level for the reference unit (308) is centered between 1.0 volts and 3.0 volts, i.e., the reference voltage level becomes 2.0 volts.

Since 2.625 volts is greater than 2.0 volts, the comparator (307) outputs a logic high, and the control unit (309) knows that the analog input (302) is between 2.0 and 3.0 volts. Therefore, using the binary search pattern, the control unit (309) again divides the possible voltage range in half by forcing the reference voltage up to 2.5 volts. The process would then be repeated (depending on the number of iterations), and the control unit (309) provides a digital output (310). SAR architectures (301) may use, for example, 2, 4, or 8 iterations (depending on the level of accuracy desired) to approximate each analog input (302) sample.

SAR ADCs typically operate at medium sample rates. Most operate at under 5 MSPS. They most commonly range in resolution from 8 to 16 bits.

Figure 4:
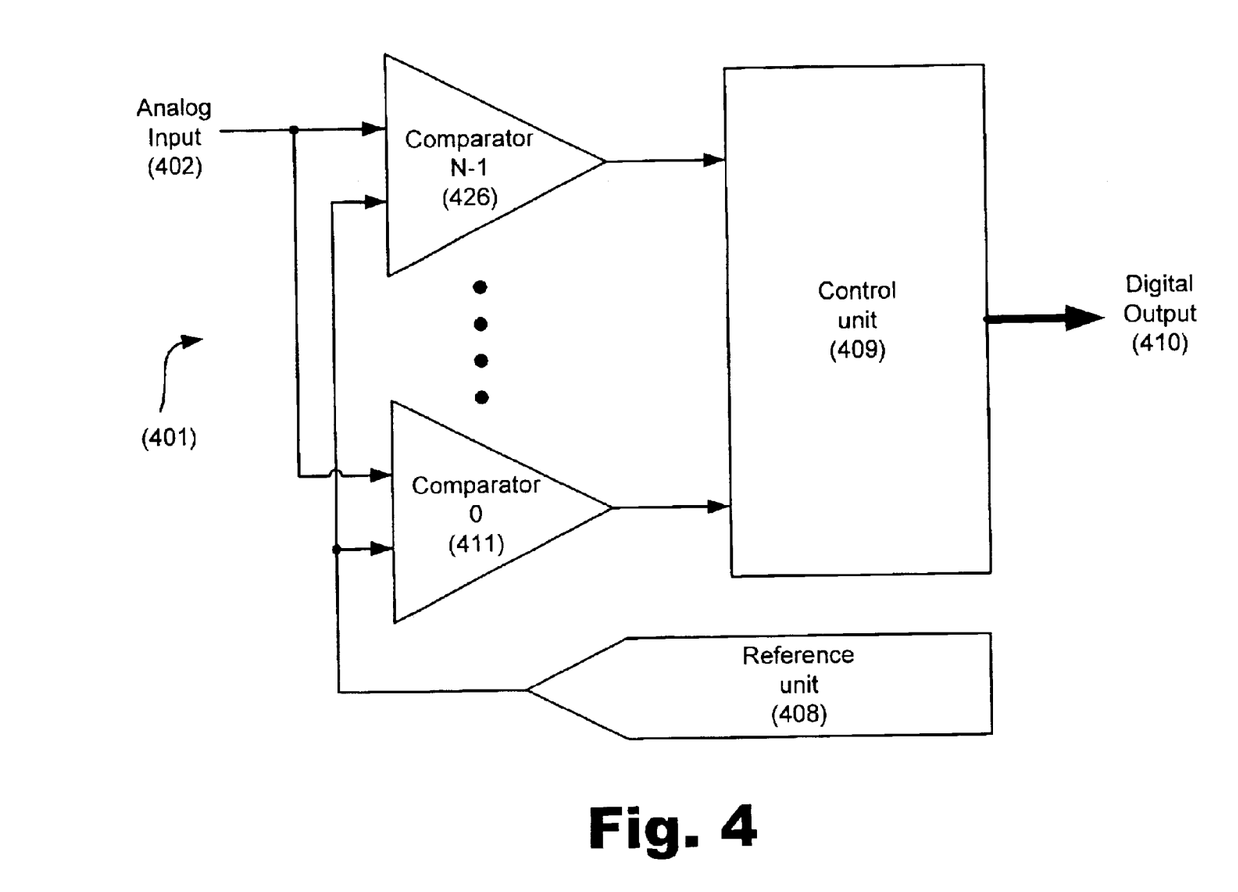
FIG. 4 is a simplified block diagram illustrating an embodiment of a flash ADC architecture.

FIG. 4 is a simplified block diagram illustrating an embodiment of a Flash ADC architecture (401). As shown in FIG. 4, a Flash ADC (401) uses a number of comparators, e.g., comparator 0 (411) through comparator N−1 (426), where N is the total number of comparators that are used. N typically equals $2^n$, where n is the number of output bits that define the resolution of the digital output (410). For example, a flash ADC (401) with 4 bits of resolution require 16 comparators.

Each comparator in the exemplary flash ADC (401) of FIG. 4 is connected to analog signal input (402) and a reference voltage. The reference unit (408) provides a different reference voltage for each comparator (411–426) creating different voltage levels. For example, a voltage source connected to a series of resistors may be used to provide a number of voltage references used by the comparators (411–426). The outputs of the comparators (411–426) are sent to the control unit (409), which interprets the comparator outputs (411–319) as a voltage level. The control unit (409), then provide an equivalent digital output (410).

For example, if the analog input is 2.625 volts, and the Flash ADC (401) uses 16 comparators (411–426) to convert an analog input (402) between 0.0 volts to 4.0 volts to a digital output (410), 16 voltage levels between 0.0 and 4.0 volts, e.g., 0.25, 0.5, 0.75, 1.0, 1.25, etc., may be used as digital outputs (410). In this embodiment, the Flash ADC (401) would provide a digital output of 2.5 or 2.75 volts to approximate the 2.625 analog input (402).

Flash ADCs may operate at extremely high sample rates. For example, they may exceed giga-sample per second (GSPS) sample rates. However, they usually only provide low resolution. Many flash ADCs are limited to around 8 bits of resolution.

Figure 5:
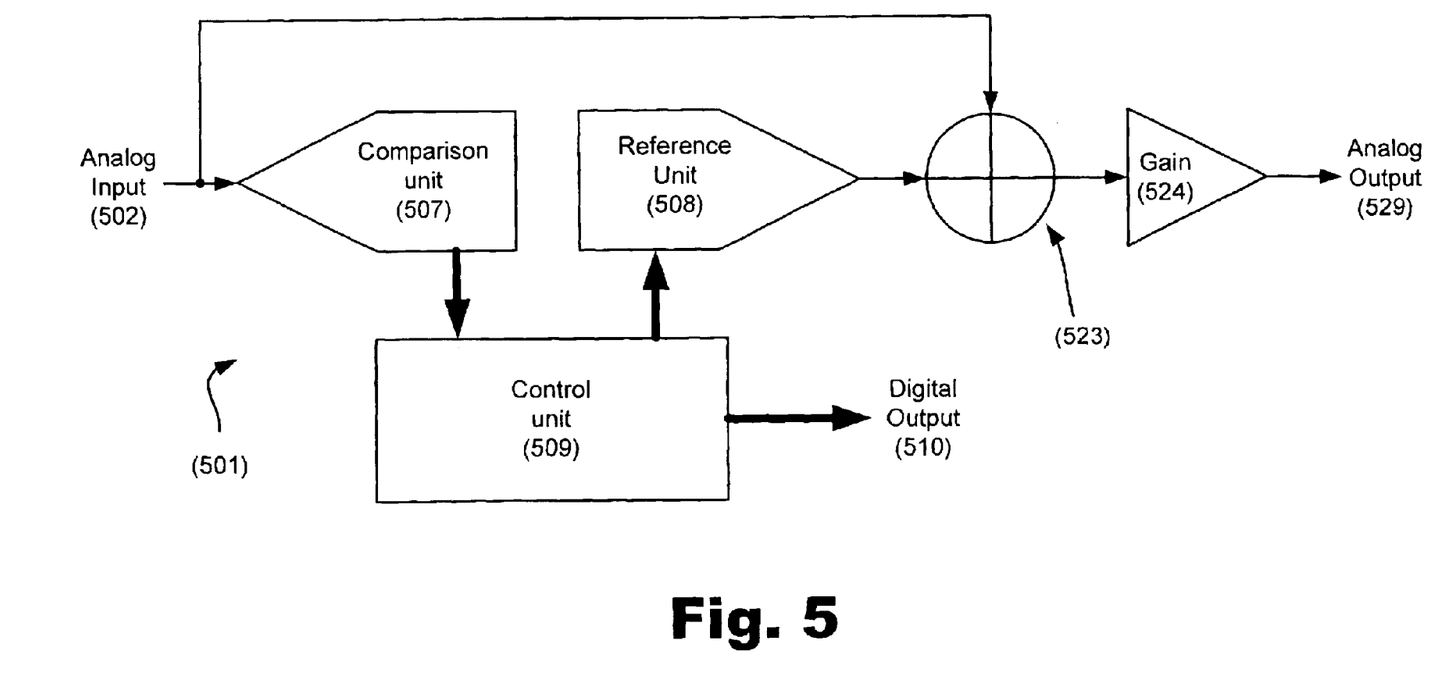
FIG. 5 is a simplified block diagram illustrating an embodiment of a Pipelined ADC architecture.

FIG. 5 is a simplified block diagram illustrating an embodiment of a Pipelined ADC architecture (501). As shown in FIG. 5, the pipelined ADC architecture (501) uses several stages of reference and comparison functions. The analog input (502) is input into a first comparison unit (507) which is preferably a flash ADC (401, FIG. 4). The output of the comparison unit (507) is fed into a control unit (509) which forwards the value to a reference unit (508). The value of analog input (502) is fed forward into a summation function (523) and subtracted from the output of the reference unit (508). A gain unit (524) is then used to rescale the result. In a common embodiment, an operational amplifier is used as a gain unit (524).

The analog output (529) is then connected to a second stage pipelined ADC (501) which is preferably identical in function and circuitry to the first stage Pipelined ADC (501). The digital outputs (510) of each stage are combined to provide the digital conversion value, with the first stage providing the most significant bits, etc. The control unit (509) takes care of the timing between stages and is often used to perform error detection and correction.

Pipelined ADCs may operate at medium to high sample rates. They may typically provide 8 to 16 bits of resolution, depending on the sample rate. Latency is associated with pipelined ADCs because each sample has to propagate through the entire pipelined before all its associated bits are available for output.

Figure 6:
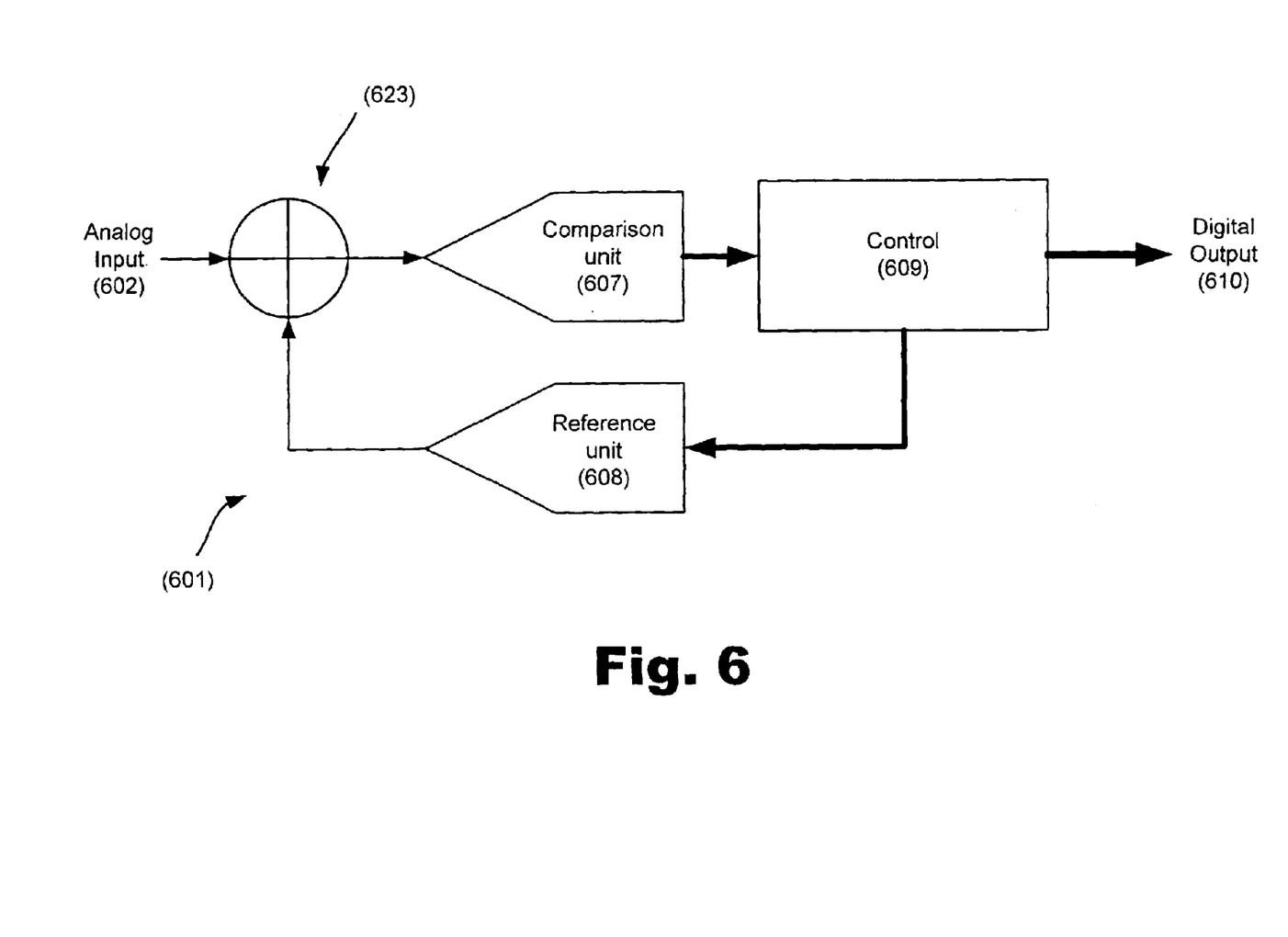
FIG. 6 is a simplified block diagram illustrating an embodiment of a Sigma Delta ADC architecture.

FIG. 6 is a simplified block diagram illustrating an embodiment of a Sigma Delta ADC architecture (601). Sigma Delta ADCs also referred to as Delta Sigma ADCs or oversampling ADCs. As shown in FIG. 6, the Sigma Delta ADC (601) takes the analog input (602) and subtracts a feedback signal in the summation unit (623). The combined signal from the summation unit (623) is input to the comparison unit (607). The comparison unit (607) may be composed of a single comparator, or another type of ADC. A common embodiment uses a flash (401, FIG. 4) converter. The output of the comparison unit (607) is sent to a control unit (609). The control unit (609) provides an appropriate digital input to the reference unit (608) which feeds back a value which is added to the analog input (603) and compared again. The Sigma Delta ADC (601) gains accuracy by over sampling the analog input signal (602) and using digital filtering in the control unit (609) to determine the digital output (610).

Sigma delta ADCs typically have low sample rates (i.e.; less than 1 MSPS). However, they are capable of providing high resolution.

The preceding embodiments of common ADC architectures have been presented to understand the present invention as illustrated in FIG. 1. According to an embodiment of the present invention, the ADC system with DSP functionality (103) of FIG. 1 may be configured to operate at a wide range of sample rates. It may also be configured to provide any of a number of resolutions according to another embodiment. Yet another embodiment is that the ADC system with DSP functionality (103) may be configured to emulate different latencies. Each of these embodiments will now be explained.

As shown in FIG. 1, the ADC system with DSP functionality (103) preferably includes a flash ADC (100). The flash ADC (100) may be similar to the flash ADC (401) that is described in connection with FIG. 4. However, according to an alternate embodiment, the flash ADC (100) of FIG. 1 may be a current mode flash ADC. A current mode flash ADC compares an analog signal's different levels of current to reference currents rather than the signal's levels of voltage to reference voltages.

The following embodiments and examples will be explained using a voltage-based flash ADC for explanatory purposes only. However, it is important to note that the present invention may be implemented using a current-mode flash ADC instead of the voltage-based flash ADC.

The flash ADC (100) of FIG. 1 is preferably a 4-bit flash ADC. A 4-bit flash ADC comprises 16 comparators and produces 4 bits of resolution. As will be described below, it is preferable for the system (103) to use a low-resolution flash ADC. Although the present invention will be described using a 4 bit flash ADC, the flash ADC (100) may be configured to have any number of bits of resolution. For example, the flash ADC (100) may be a 2, 3, or 8 bit flash ADC.

As shown in FIG. 1, an analog input signal is input into the flash ADC (100). The flash ADC (100) samples the analog input signal at a programmable sample rate. Because flash ADCs are capable of the highest sample rates among all ADC architectures, the sample rate of the flash ADC (100) may be varied so that the ADC system with DSP functionality (103) may operate at the sample rate of any other ADC architecture.

The sample rate at which the flash ADC (100) operates may be programmed or modified using many different methods. For example, the flash ADC (100) may have an input for a signal that signals it to operate at a given sample rate. The signal may be modified by a host computer, by the DSP function (101), by a user, or by any other means capable of setting the flash ADC's (100) sample rate.

After the flash ADC (100) has sampled the analog input, the digitized signal is input in to a DSP (101). The DSP (101), as will be understood by one skilled in the art, may be programmed to perform various functions that manipulate or modify a digital signal. DSPs are preferable because they may be easily reprogrammed, thus allowing the system (103) to easily switch between different characteristics of various ADC architectures without modifying the hardware of the system (103). However, other integrated circuits or processors that are capable of manipulating digital signals may be used in place of the DSP (101), such as application specific integrated circuits (ASICs) or field-programmable gate arrays (FPGAs).

Figure 7:
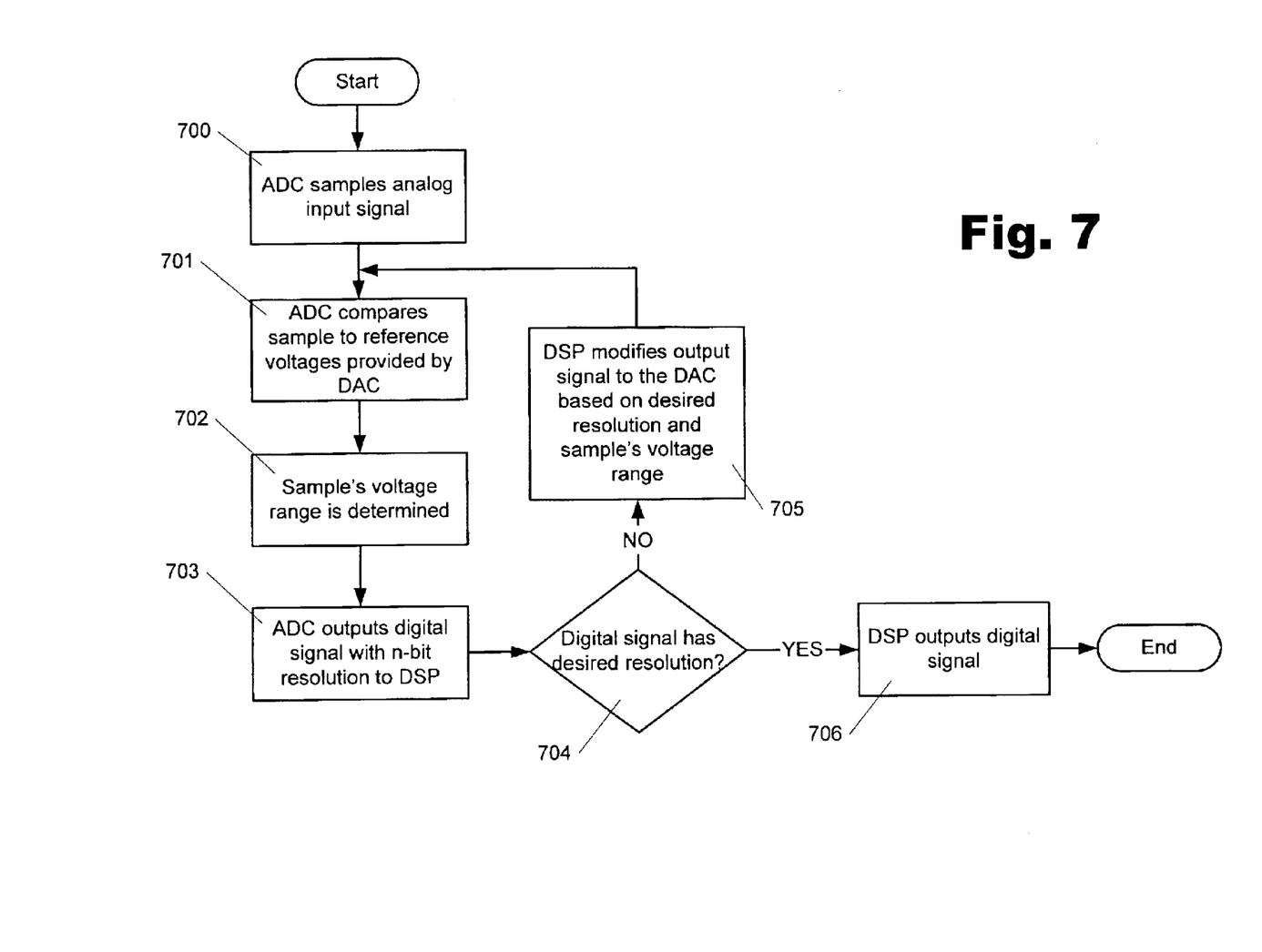
FIG. 7 is a flowchart illustrating an iterative process that may be used to achieve a desired resolution using the ADC system with DSP functionality, according to an embodiment of the present invention.

According to an embodiment of the present invention, the ADC system with DSP functionality (103) uses an iterative process to achieve a desired resolution. An exemplary iterative process will be explained using the flowchart of FIG. 7. As shown in FIG. 7, the first step is sampling an analog input signal with the flash ADC (step 700). After the analog input signal is sampled, the flash ADC (100) compares the sample's voltage level to reference voltages provided by the DAC (102) (step 701). Based on these comparisons, the flash ADC (100) determines the voltage range within which the sample's voltage falls (step 702). The voltage ranges will be described in more detail in connection with FIG. 8.

As shown in FIG. 7, after the sample's voltage range is determined, the ADC outputs a digital signal with n-bits of resolution to the DSP (101) (step 703). For example, the flash ADC (100) may output a digital signal with 4 bits of resolution.

After the digital signal has been output from the flash ADC (100), the DSP (101) determines whether the digital signal has the desired resolution (step 704). The desired resolution may be 16 bits, for example. If the desired resolution is 16 bits and the flash ADC (100) output a digital signal with 4 bits of resolution, then the digital signal does not have the desired resolution and an iterative loop is entered into and repeated until the desired resolution is achieved. This loops consists of the DSP (101) first modifying the output signal to the reference DAC (102) based on the desired resolution and on the sample's determined voltage range (step 705). The modification of the output signal supplied to the DAC (102) forces the DAC (102) to supply narrower reference voltages to the flash ADC (100). The flash ADC (100) then compares the sample to the new reference voltages provided by the DAC (102) (step 701), determines the sample's voltage range (step 702), and outputs a new digital signal with n-bit resolution to the DSP (101) (step 703).

Thus, with each successive iterative loop, the analog sample may be represented with more bits and therefore more resolution. Once the digital signal has the desired resolution, the DSP (101) outputs the digital signal (step 706). It is important to note that the steps of FIG. 7 are exemplary and not exclusive. An alternate embodiment to the process of FIG. 7 is that current, instead of voltage, is used in the comparisons as the reference values. The process of FIG. 7 will now be applied to two exemplary configurations shown in FIGS. 8 and 9.

Figure 8:
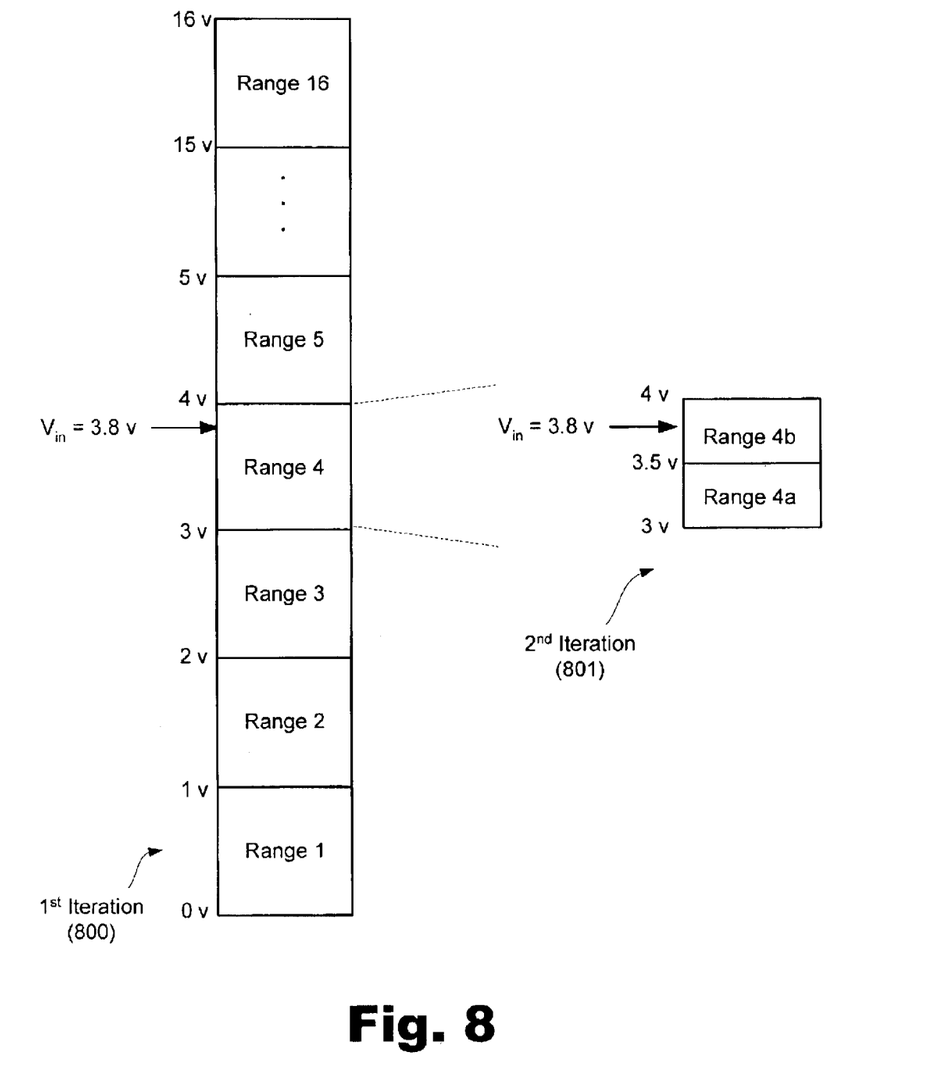
FIG. 8 shows an exemplary process wherein the resolution of a sample of an analog signal is increased one bit per iteration.

FIG. 8 shows an exemplary process wherein the resolution of a sample of an analog signal is increased 1 bit per iteration. In the example of FIG. 8, two iterations are used to increase the resolution of an analog signal sample from 4 bits to 5 bits. In the example of FIG. 8, the analog sample has a voltage, Vin, of 3.8 volts. FIG. 8 shows that there are a number of voltage ranges within which the sample of an analog signal may fall. The ranges shown in FIG. 8 are exemplary and will vary as best serves a particular application. As shown in FIG. 8, the analog sample may have a voltage level that is between 0 volts and 16 volts. Because the flash ADC (100) is a 4-bit flash ADC in this example, there are 16 comparators and thus 16 possible ranges between 0 volts and 16 volts within which a sample of an analog signal may lie. In the example of FIG. 8, each range is equal to 1 volt.

As shown in FIG. 8, the first iteration (800) of the process described in connection with FIG. 7 determines that Vin is between 3 volts and 4 volts. Thus, it is within range 4, as shown in FIG. 8. However, Vin in this iteration is digitally represented using only 4 bits. The process therefore goes through a second iteration (801) to achieve the desired 5-bit resolution.

The second iteration (801) begins with the DSP (101) modifying the output signal to the DAC (102) so that the DAC provides reference voltages that result in narrower ranges within which Vin may fall. A preferable embodiment is that the DSP (101) forces the DAC (102) to provide voltage references to the flash ADC (100) that result in ranges that are half as large as they were in the first iteration (800). Thus, in this example, the new voltage ranges are each 0.5 volts, as shown by the ranges 4a and 4b. The flash ADC (100) then compares Vin with the new voltage ranges and determines that Vin falls within the voltage range 4b.

As will be understood by one skilled in the art, a single bit may represent the results of the second iteration (801) because the flash ADC (100) only has to choose between two possible ranges (4a and 4b). An embodiment of the present invention is that this one bit is combined with the 4 bits of resolution that were output after the first iteration (800) so that Vin may be represented by 5 bits. There are many possible methods of combining the bit outputs from each iteration (800 and 801) so that Vin may be represented by 5 bits. The particular method will vary as best serves the particular application and may be implemented according to principles known to one skilled in the art.

Figure 9:
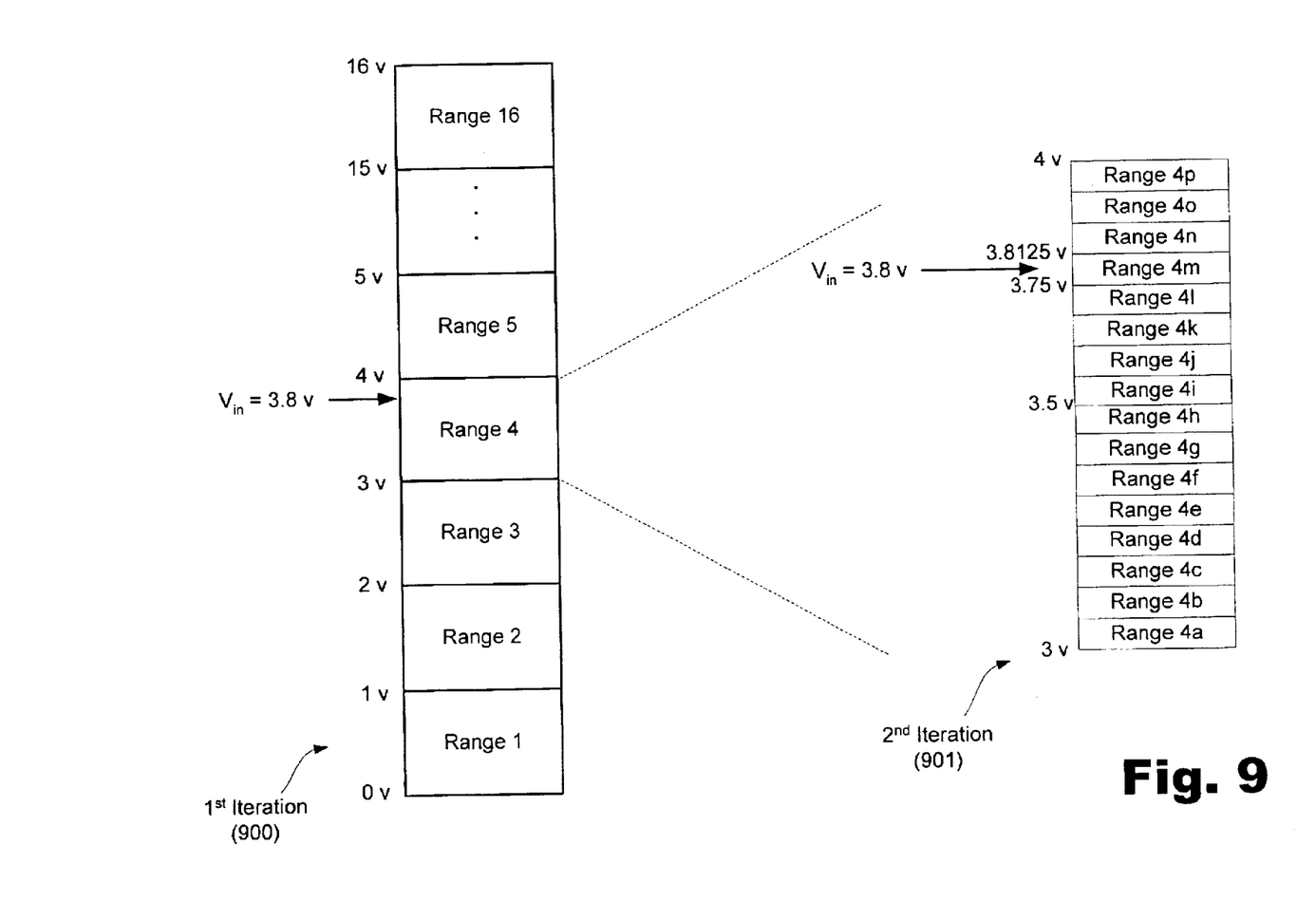
FIG. 9 shows an exemplary process wherein the resolution of a sample of an analog signal is increased by four bits per iteration.

FIG. 9 shows an exemplary process wherein the resolution of a sample of an analog signal is increased by 4 bits per iteration. In the example of FIG. 9, two iterations are used to increase the resolution of an analog signal sample from 4 bits to 8 bits. In the example of FIG. 9, the analog sample has a voltage, Vin, of 3.8 volts. As in the example of FIG. 8, the analog sample may have a voltage level that is between 0 volts (v) and 16 volts. Because the flash ADC (100) is a 4-bit flash ADC in this example, there are 16 comparators and thus 16 possible ranges between 0 volts and 16 volts within which a sample of an analog signal may lie. In the example of FIG. 9, each range is equal to 1 volt.

As shown in FIG. 9, the first iteration (900) of the process described in connection with FIG. 7 determines that Vin is within 3 volts and 4 volts. Thus, it is within range 4, as shown in FIG. 9. However, Vin in this iteration is digitally represented using only 4 bits. The process therefore goes through a second iteration (901) to achieve the desired 8-bit resolution.

The second iteration (901) begins with the DSP (101) modifying the output signal to the DAC (102) so that the DAC provides reference voltages that result in narrower ranges within which Vin may fall. A preferable embodiment is that the DSP (101) forces the DAC (102) to provide voltage references to the flash ADC (100) that result in ranges that are one-sixteenth as large as they were in the first iteration (900). Thus, in this example, all 16 of the comparators of the flash ADC (100) are used, resulting in new voltage ranges that are each $\frac{1}{16}$ volts, or 0.0625 volts. The 16 new ranges (4a–4p) are shown in FIG. 9. The flash ADC (100) then compares Vin with the new voltage ranges and determines that Vin falls within the voltage range 4m, as shown in FIG. 9.

As will be understood by one skilled in the art, 4 bits may represent the results of the second iteration (901) because the flash ADC (100) has to choose between 16 possible ranges (4a–4p). An embodiment of the present invention is that these 4 new bits are combined with the 4 bits of resolution that were output after the first iteration (900) so that Vin may be represented by 8 bits. There are many possible methods of combining the bit outputs from each iteration (900 and 901) so that Vin may be represented by 8 bits. The particular method will vary as best serves the particular application and may be implemented according to principles known to one skilled in the art.

Although FIGS. 8 and 9 illustrated methods of increasing the resolution by 1 bit per iteration and by 4 bits per iteration, respectively, other methods may be used to increase the resolution by different bit values, according to another embodiment of the present invention. These different bit values will vary as best serves a particular application and may be implemented using methods similar to those explained in connection with FIGS. 8 and 9.

Another advantage of using the iterative process of FIG. 7 to increase the number of bits of resolution is that the ADC system with DSP functionality (103) does not have to increase in physical size to accommodate high resolutions. This is because a fixed number of comparators and other components is used, regardless of the resolution rendered. Because the ADC system with DSP functionality (103) does not use a large number of components, power consumption may be lower than other architectures.

Latency may also be emulated using the ADC system with DSP functionality (103). According to an embodiment of the present invention, the DSP (101) may be programmed to add one or more serial delays to the output of the digital signal to equal a desired latency. For example, a particular pipelined ADC architecture may have latency equal to the number of stages plus one. To emulate this pipelined ADC, the DSP could add one serial delay to equal this latency.

According to another embodiment of the present invention, the DSP (101) may perform one or more of a number of other functions on the digital signal output of the flash ADC (100). For example, nearly all ADCs are followed by some kind of filter function such as a finite impulse response (FIR) filter. According to this embodiment, the DSP (101) may implement an FIR filter function or any of a number of filter functions for the digital signal output by the flash ADC (100). The exact filter type will vary as best serves a particular application. A filter maybe implemented or programmed into the DSP (101) according to principles known by one skilled in the art.

Another embodiment is that the DSP (101) provides digital correction for non-linearity and offset. Ideally, the voltage or current ranges as defined by the comparators of the flash ADC (100) are divided into equal steps (i.e.; the 16 steps of FIG. 8). However, in practice the steps are not exactly equal, which leads to non-linearity in a plot of ADC output against input voltage. According to one embodiment, the DSP (101) measures a known signal such as a ramp generated by the DAC (102) or by an external device during a start up or initialization cycle. These measurements are used to generate coefficients that are used during run time to correct for offset and non-linearity.

The preceding description has been presented only to illustrate and describe embodiments of invention. It is not intended to be exhaustive or to limit the invention to any precise form disclosed. Many modifications and variations are possible in light of the above teaching. It is intended that the scope of the invention be defined by the following claims.

What is claimed is:

1. A system for emulating characteristics of a plurality of analog-to-digital converter (ADC) architectures in the conversion of an analog signal to a digital signal, said system comprising:
   a flash ADC for sampling said analog signal and outputting a digital representation of a sample of said analog signal, said digital representation based on a comparison of said sample to reference values and comprising a number of bits of resolution;
   a digital-to-analog converter (DAC) for supplying said reference values to said flash ADC; and
   a digital signal processor (DSP) for processing said digital representation of said sample and outputting said digital signal;
   wherein said DSP is configured to control said DAC and combine iterations of said sampling to produce a desired resolution of said digital signal based on an ADC architecture being emulated.

2. The system of claim 1, wherein said flash ADC operates at different sample rates based on said ADC architecture being emulated.

3. The system of claim 1, wherein said DSP adds one or more serial delays to said digital signal to emulate latency.

4. The system of claim 3. wherein said latency is determined by a specific ADC architecture being emulated.

5. The system of claim 1, wherein said DSP iteratively modifies a control signal for said DAC in response to said desired resolution and outputs said control signal to said DAC, said control signal causing said DAC to iteratively provide narrower reference values to said flash ADC until said desired resolution is achieved.

6. The system of claim 1, wherein said number of bits of resolution is four.

7. The system of claim 1, wherein said reference values are voltage values.

8. The system of claim 1, wherein said reference values are current values.

9. The system of claim 1, wherein said DSP performs a filter function on said digital signal.

10. The system of claim 1, wherein said DSP provides digital correction for non-linearity and offset.

11. The system of claim 1, wherein said system emulates characteristics of a pipelined ADC architecture, a Sigma Delta ADC architecture, a Successive Approximation Register (SAR) ADC architecture, or a Dual-slope ADC architecture.

12. A method of emulating characteristics of a plurality of analog-to-digital converter (ADC) architectures in the conversion of an analog signal to a digital signal, said method comprising:

processing a digital representation of samples of said analog signal with a digital signal processor (DSP) and outputting a control signal based on information derived from said digital representation, said digital representation produced by a flash ADC, said control signal controlling a digital-to-analog converter (DAC) that provides reference values to said flash ADC; and combining a number of said samples to produce said digital signal with a desired resolution.

13. The method of claim 12, further comprising adding one or more serial delays to said digital signal to emulate latency.

14. The method of claim 12, wherein said number of samples combined depends on a particular ADC architecture being emulated.

15. The method of claim 12, further comprising adjusting a sampling rate of said samples in accordance with a particular ADC architecture being emulated.

16. A method of emulating characteristics of a plurality of analog-to-digital converter (ADC) architectures in the conversion of an analog signal to a digital signal, said method comprising:

processing a digital representation of a sample of said analog signal with a digital signal processor (DSP);

outputting a control signal based on information derived from said digital representation, said digital representation produced by a flash ADC, said control signal controlling a digital-to-analog converter (DAC) that provides reference values to said flash ADC;

deriving said sample by sampling said analog signal with said flash ADC at a controllable sample rate;

comparing said sample to said reference values provided by said DAC;

determining a voltage range within which said sample's voltage falls; and outputting a digital representation of said sample from said flash ADC to said DSP, said digital representation based on said voltage range, said digital representation comprising a number of bits of resolution.

17. The method of claim 16, wherein one of said characteristics is a higher resolution than said resolution of said digital representation output by said flash ADC.

18. The method of claim 17, further comprising iteratively modifying said control signal to said DAC in response to said higher resolution and outputting said control signal to said DAC, said control signal causing said DAC to iteratively provide narrower reference values to said flash ADC until said higher resolution is achieved.

19. The method of claim 16, wherein said number of bits of resolution is four.

20. A system for emulating characteristics of a plurality of analog-to-digital converter (ADC) architectures in the conversion of an analog signal to a digital signal, said system comprising:

means for sampling said analog sample at a sampling rate based on a specific ADC architecture being emulated; and means for combining samples from said means for sampling to produce said digital signal based on a target resolution of said ADC architecture being emulated.

21. A system for emulating characteristics of a plurality of analog-to-digital converter (ADC) architectures in the conversion of an analog signal to a digital signal, said system comprising:

means for processing a digital representation of a sample of said analog signal, said digital representation produced by a flash ADC;

means for deriving a control signal based on information derived from said digital representation, said control signal controlling reference values provided by a digital-to-analog converter (DAC) to said flash ADC;

means for deriving said sample at a programmable sample rate;

means for comparing said sample to said reference values;

means for determining a voltage range within which said sample's voltage falls; and means for outputting a digital representation of said sample, said digital representation based on said voltage range, said digital representation comprising a number of bits of resolution.

22. A system for emulating characteristics of a plurality of analog-to-digital converter (ADC) architectures in the conversion of an analog signal to a digital signal, said system comprising:

means for processing a digital representation of a sample of said analog signal, said digital representation produced by a flash ADC;

means for deriving a control signal based on information derived from said digital representation, said control signal controlling reference values provided by a digital-to-analog converter (DAC) to said flash ADC; and means for iteratively providing narrower reference values to said flash ADC until a pre-determined higher resolution is achieved.

23. A system for emulating characteristics of a plurality of analog-to-digital converter (ADC) architectures, said system comprising:

a flash ADC for sampling an analog signal at a sampling rate determined by an ADC architecture being emulated and outputting a digital representation of each sample based on a comparison of said sample to reference values; and a digital signal processor (DSP) for combining samples taken by said flash ADC to produce said digital signal with a resolution in accordance with said ADC architecture being emulated.

24. The system of claim 23, further comprising a digital-to-analog converter (DAC) controlled by said DSP to supply said reference values to said flash ADC.

25. The system of claim 24, wherein said DSP iteratively modifies a control signal for said DAC based on said resolution and outputs said control signal to said DAC, said control signal causing said DAC to iteratively provide narrower reference values to said flash ADC until said resolution is achieved.

26. The system of claim 23, wherein said DSP adds a delay to said digital signal, wherein said delay is added to match a latency of said ADC architecture being emulated.

27. The system of claim 23, wherein said DSP provides digital correction for non-linearity and offset.

28. The system of claim 23, wherein said system emulates a pipelined ADC architecture, a Sigma Delta ADC architecture, a Successive Approximation Register (SAR) ADC architecture, or a Dual-slope ADC architecture.

* * * * *